(12) United States Patent
Aki et al.

(10) Patent No.: US 10,923,645 B2
(45) Date of Patent: Feb. 16, 2021

(54) LIGHT SOURCE DEVICE HAVING PACKAGE INCLUDING FIRST ELECTRODE AND SECOND ELECTRODE AND SUBSTRATE INCLUDING WIRING MEMBERS FACING FIRST ELECTRODE AND SECOND ELECTRODE

(71) Applicant: NICHIA CORPORATION, Anan (JP)

(72) Inventors: Takeshi Aki, Tokushima (JP); Ryosuke Wakaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/710,309

(22) Filed: Dec. 11, 2019

(65) Prior Publication Data

US 2020/0119245 A1 Apr. 16, 2020

Related U.S. Application Data

(63) Continuation of application No. 15/958,445, filed on Apr. 20, 2018, now Pat. No. 10,541,354.

(30) Foreign Application Priority Data

Apr. 21, 2017 (JP) .............................. JP2017-084830

(51) Int. Cl.
*H01L 27/15* (2006.01)
*H01L 31/12* (2006.01)
(Continued)

(52) U.S. Cl.
CPC .............. *H01L 33/62* (2013.01); *H01L 33/08* (2013.01); *H01L 33/38* (2013.01); *H01L 33/40* (2013.01);
(Continued)

(58) Field of Classification Search
CPC ......... H01L 33/08; H01L 33/38; H01L 33/40; H01L 33/486; H01L 33/62
(Continued)

(56) References Cited

U.S. PATENT DOCUMENTS 6,867,492 B2  3/2005 Auburger et al.
9,012,267 B2  4/2015 Yin et al.
(Continued)

FOREIGN PATENT DOCUMENTS

JP   2011-029634 A   2/2011
JP   2014-130973 A   7/2014
(Continued)

OTHER PUBLICATIONS

Non-Final Office Action in the parent U.S. Appl. No. 15/958,445 dated Jan. 11, 2019.
(Continued)

*Primary Examiner* — Duy T Nguyen
*Assistant Examiner* — Dilinh P Nguyen
(74) *Attorney, Agent, or Firm* — Global IP Counselors, LLP

(57) ABSTRACT

A light source device includes a package and a substrate. The package includes first and second electrodes. The first electrode has first and second parts separated from each other by a first separation region on a lower surface side of the first electrode while the first part is continuous with the second part on an upper surface side. The substrate includes a pair of wiring members. Lower surfaces of the first and second parts face and are mounted on an upper surface of one of the wiring members. A lower surface of the second electrode faces and is mounted on an upper surface of the other of the wiring members. A region of the substrate facing the first separation region has solder wettability lower than solder wettability of the upper surface of the one of the wiring (Continued)

members facing the first part and the second part of the first electrode.

14 Claims, 10 Drawing Sheets

(51) Int. Cl.
    *H01L 23/48*    (2006.01)
    *H01L 23/52*    (2006.01)
    *H01L 33/62*    (2010.01)
    *H01L 33/40*    (2010.01)
    *H01L 33/08*    (2010.01)
    *H01L 33/38*    (2010.01)
    *H01L 33/48*    (2010.01)

(52) U.S. Cl.
    CPC .... *H01L 33/486* (2013.01); *H01L 2933/0066* (2013.01)

(58) Field of Classification Search
    USPC .......................................... 257/79, 778, 779
    See application file for complete search history.

(56) References Cited

U.S. PATENT DOCUMENTS

| 2012/0113328 | A1  | 5/2012 | Takeshima et al. |
| 2013/0214316 | A1* | 8/2013 | Lai ........................ H05K 1/111 257/99 |
| 2014/0183574 | A1  | 7/2014 | Nakabayashi et al. |
| 2015/0001559 | A1  | 1/2015 | Sasaoka et al. |
| 2015/0070924 | A1* | 3/2015 | Kadowaki ............... F21S 41/19 362/517 |
| 2016/0247978 | A1  | 8/2016 | Ishida et al. |

FOREIGN PATENT DOCUMENTS

| JP | 2015-029052 A | 2/2015 |
| JP | 2015-056228 A | 3/2015 |
| JP | 2016-157918 A | 9/2016 |
| JP | 2017-017161 A | 1/2017 |

OTHER PUBLICATIONS

Final Office Action in the parent U.S. Appl. No. 15/958,445 dated Jul. 26, 2019.
Notice of Allowance in the parent U.S. Appl. No. 15/958,445 dated Sep. 30, 2019.

\* cited by examiner

LIGHT SOURCE DEVICE HAVING PACKAGE INCLUDING FIRST ELECTRODE AND SECOND ELECTRODE AND SUBSTRATE INCLUDING WIRING MEMBERS FACING FIRST ELECTRODE AND SECOND ELECTRODE

CROSS-REFERENCE TO RELATED APPLICATION

This Application is a continuation application of U.S. patent application Ser. No. 15/958,445, filed on Apr. 20, 2018. This application claims priority to Japanese Patent Application No. 2017-084830, filed on Apr. 21, 2017. The entire disclosures of U.S. patent application Ser. No. 15/958, 445 and Japanese Patent Application No. 2017-084830 are hereby incorporated herein by reference.

BACKGROUND

The present disclosure relates to a light source device.

Various light source devices in which one or more light emitting devices are mounted on a substrate are available. With such a light source device, it is known that light distribution of the light emitting devices influences light emitted from the light source device (see Japanese Patent Publication No. 2016-157918 and others). Accordingly, there exists demand for a light source device in which misalignment of light emitting devices is reduced so that desirable light distribution is achieved when mounting of the light emitting devices is completed.

SUMMARY

An object of certain embodiment of the present disclosure is to provide a light source device in which misalignment is reduced.

A light source device includes a package and a substrate. The package includes first and second electrodes. The first electrode has first and second parts separated from each other by a first separation region on a lower surface side of the first electrode while the first part is continuous with the second part on an upper surface side of the first electrode. The substrate includes a pair of wiring members. Lower surfaces of the first and second parts of the first electrode face and are mounted on an upper surface of one of the wiring members. A lower surface of the second electrode faces and is mounted on an upper surface of the other of the wiring members. A region of the substrate facing the first separation region has solder wettability lower than solder wettability of the upper surface of the one of the wiring members facing the first part and the second part of the first electrode.

An embodiment of the present disclosure provides a light source device in which misalignment is reduced.

DETAILED DESCRIPTION OF EMBODIMENTS

Figure 1:
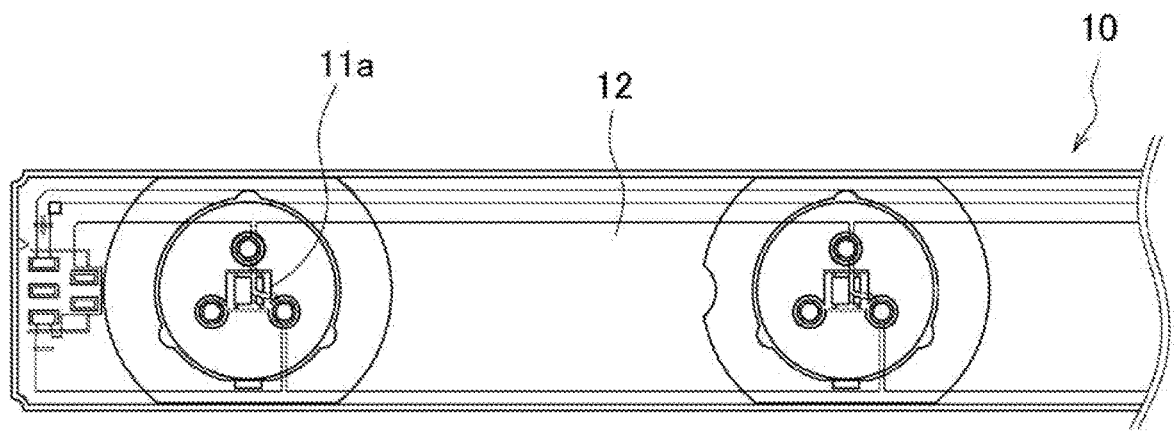
FIG. 1 is a schematic partial top view showing one embodiment of a light source device according to one embodiment of the present disclosure.

In the following, a description will be given of embodiments of the present invention with reference to the drawings as appropriate. Note that, the embodiments described in the following are for embodying the technical idea of the present disclosure, and do not specify the present disclosure to the following. Further, the content described in one embodiment is applicable to other embodiment. The size, positional relationship or the like of members shown in the drawings may be exaggerated for the sake of clarity.

Light Source Device

As shown in FIG. 1, a light source device 10 according to certain embodiment of the present disclosure includes an electronic component 11a and a substrate 12.

Electronic Component 11a

The electronic component 11a is a component mounted on the substrate 12 and constituting a part of the light source device 10.

The electronic component 11a is, for example, a semiconductor light emitting element 14 such as a light emitting diode or a laser diode, or a light emitting device 11 in which the semiconductor light emitting element 14 is installed.

Figure 2A:
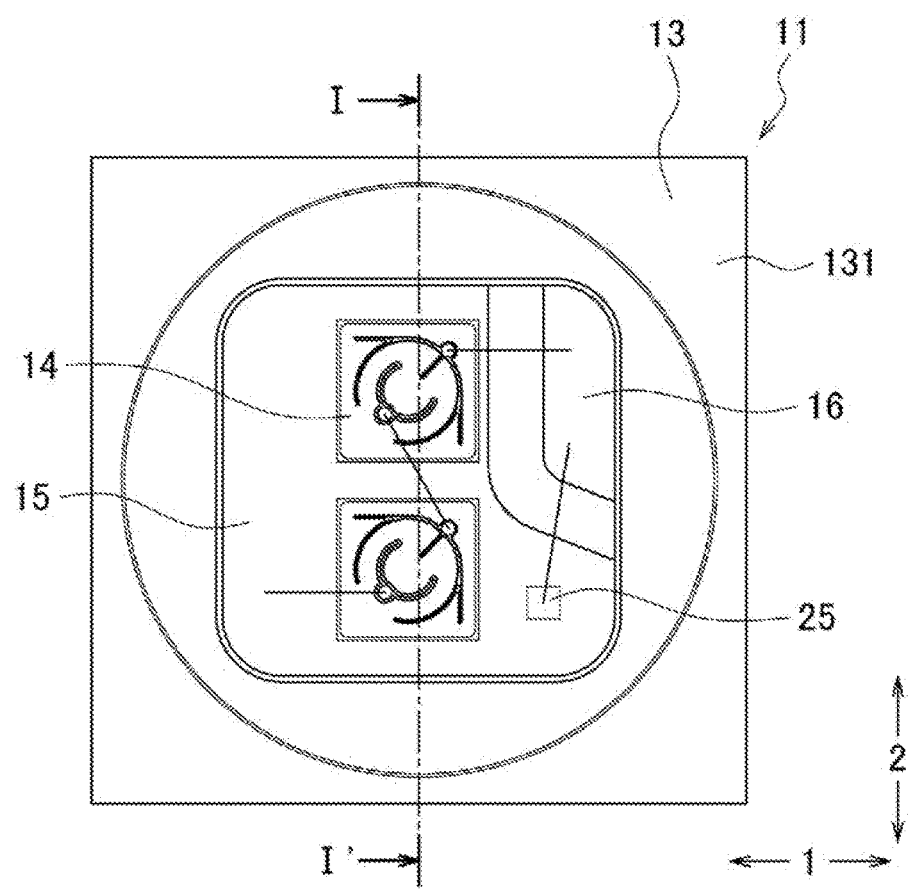
FIG. 2A is a schematic top view showing one embodiment of light emitting device of the light source device shown in FIG. 1.
Figure 2B:
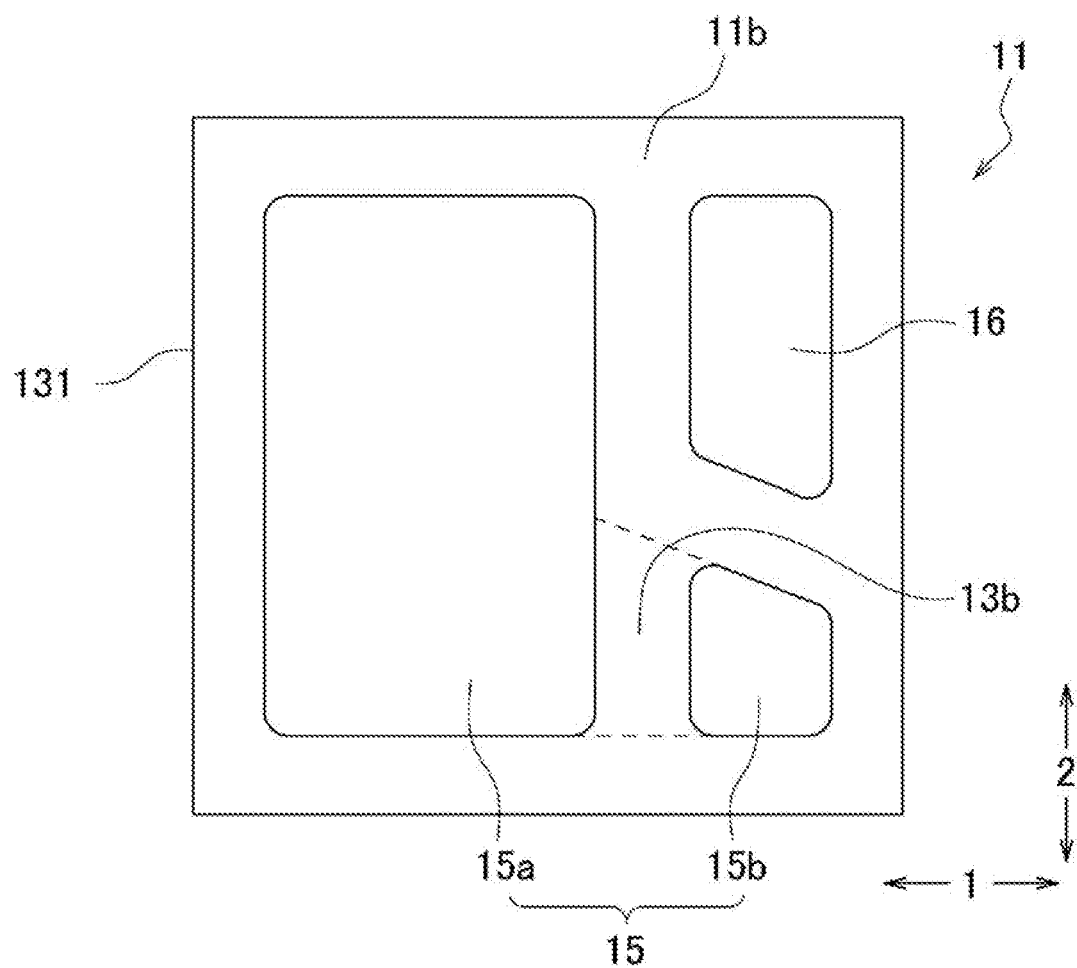
FIG. 2B is a schematic bottom view showing a light emitting device shown in FIG. 2A.
Figure 2C:
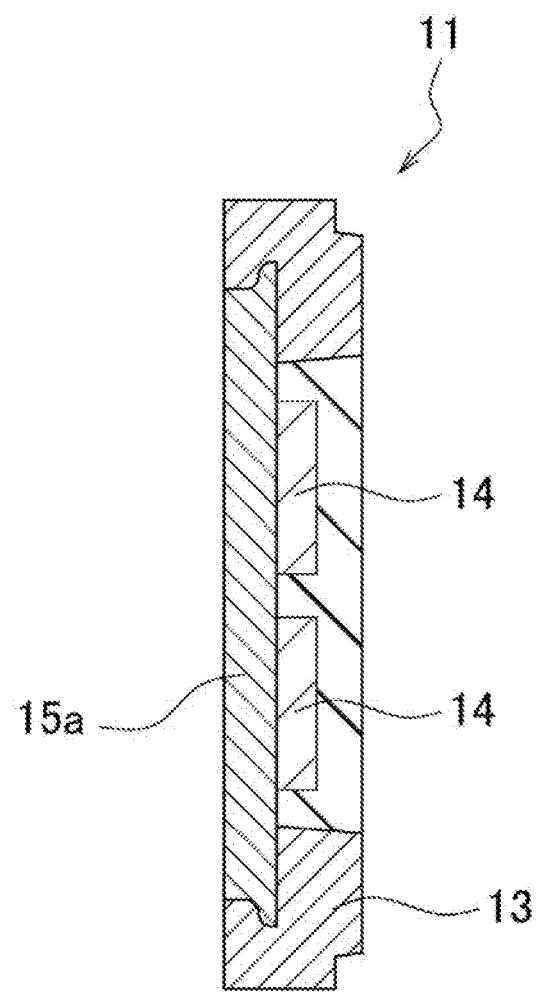
FIG. 2C is a schematic section view taken along line I-I' shown in FIG. 2A.

FIGS. 2A to 2C show an exemplary light emitting device 11 employed as the electronic component 11a. FIG. 2A is a schematic top view of the light emitting device 11. FIG. 2B is a schematic bottom view of the light emitting device 11. FIG. 2C is a schematic section view taken along line I-I' in FIG. 2A. FIG. 2C does not show wires. The light emitting device 11 includes a package 13 and the semiconductor light emitting elements 14. The package 13 includes a base member 131, a first electrode 15, and a second electrode 16. The base member 131 is formed with a resin member which is obtained by curing one or more light reflecting materials. In the package 13 shown in FIG. 2A, the base member 131, the first electrode 15, and the second electrode 16 are integrally formed.

The outer shape of the electronic component 11a as seen in the top view may be, for example, a polygon such as a quadrangle, a circle, or any shape similar to the foregoing. For example, the outer shape of the light emitting device 11 as seen in the top view is a quadrangle having a pair of sides extending in the first direction and a pair of sides extending in the second direction.

The first electrode 15 and the second electrode 16 are members for supplying power to the electronic component 11a. Accordingly, the first electrode 15 and the second electrode 16 are suitably formed with a material being good in wettability with a bonding member such as solder. In the light emitting device 11 shown in FIG. 2A, two semiconductor light emitting elements 14 are disposed on the upper surface of the first electrode 15, and the two semiconductor light emitting elements 14 are electrically connected to the first electrode 15 and the second electrode 16 via wires. Note that, the disposition of the semiconductor light emitting elements 14 is not specified thereto. For example, the semiconductor light emitting elements 14 may be disposed across the first electrode 15 and the second electrode 16. Further, at least one of the semiconductor light emitting elements 14 may be disposed on the upper surface of each of the first electrode 21 and the second electrode 22.

The first electrode 15 and the second electrode 16 are positioned on a lower surface 11b of the electronic component 11a. In the light emitting device 11 shown in FIG. 2B, the first electrode 15 and the second electrode 16 are provided so as to be exposed at the lower surface 11b of the base member 131 of the light emitting device 11. The first electrode 15 and the second electrode 16 positioned on the lower surface 11b of the electronic component 11a are bonded to wiring layers 19 (later described) of the substrate 12 via solder.

The first electrode 15 includes a first part 15a and a second part 15b on the lower surface 11b of the electronic component 11a. The first part 15a and the second part 15b are separated from each other by a separation region 13a. More specifically, the first electrode 15 includes the first part 15a and the second part 15b separated by the separation region 13a interposed therebetween. In contrast, the upper surface of the first electrode 15 is structured as one surface. In the light emitting device 11 shown in FIG. 2B, the first electrode 15 includes, a recessed part 13b (i.e., the region defined by broken lines) on the lower surface thereof. In the recessed part 13b, part of the base member 131 is provided. On the lower surface 11b, the first part 15a and the second part 15b are separated from each other via the base member 131 filled in the recessed part 13b to which part of the first electrode 15 on the upper surface corresponds. The recessed part 13b between the first part 15a and the second part 15b of the first electrode 15 can be formed by a known method. For example, providing a flat plate-like metal plate, and subjecting the flat plate-like metal plate to etching work or press work, a lead frame having portions respectively becoming the first electrode 15 and the second electrode 16 is obtained. The recessed part 13b is formed on the lead frame during or in another operation of forming the portions to be the first electrode 15 and the second electrode 16. Specifically, the recessed part 13b is formed by subjecting part of the portion to be the first electrode 15 on the lower surface of the metal plate or the lead frame to etching work or press work, while avoiding penetration in the thickness direction.

At the lower surface lib of the electronic component 11a, the planar shape of the first part 15a is different from the planar shape of the second part 15b. In the light emitting device 11 shown in FIG. 2B, the first part 15a and the second part 15b are adjacent to each other in the first direction, and the length of the first part 15a extending in the second direction is greater than the length of the second part 15b extending in the second direction. Further, the length of the first part 15a extending in the first direction is greater than the length of the second part 15b extending in the first direction. In the case where the first part 15a and the second part 15b of the first electrode 15 each have a shape different from each other, the magnitude of the pulling force of the solder acting in mounting the electronic component 11a on the substrate 12 is different between the first part 15a and the second part 15b. This may cause misalignment of the electronic component 11a when the electronic component 11a is mounted on the substrate 12. In the light source device 10 of the present disclosure, the substrate 12 includes a first region 21 with poor (lower) solder wettability and the first region 21 is provided at the position facing the separation region 13a between the first part 15a and the second part 15b. By virtue of the first region 21 being positioned at the particular position in the substrate 12, misalignment of the electronic component 11a is reduced by the first region 21 also in the case where an electronic component including the first part 15a and the second part 15b of the first electrode 15 each having a shape different from each other is employed, which contributes to improvement of mounting precision of the electronic component 11a.

In the foregoing, while the light emitting device 11 has been exemplarily described as the electronic component 11a, the electronic component 11a is not limited to the light emitting device 11. The electronic component 11a may be other element such as a semiconductor light emitting element, a power semiconductor, a power supply rectifying diode, a Zener diode, a variable capacitance diode, a PIN diode, a Schottky barrier diode, a photodiode, a solar battery, a surge-protective diode, a varistor, a capacitor, a resistor, a transistor, a bipolar transistor, a field effect transistor, a phototransistor, a CCD image sensor, a thyristor, an optical trigger thyristor, memory including DRAM and SRAM, or a microprocessor. In the case where the light source device 10 includes a plurality of electronic components 11a, the light emitting devices 11 and the foregoing electronic components may be used as the electronic components 11a.

Preferably, the semiconductor light emitting element 14 particularly includes a nitride semiconductor ($In_xAl_yGa_{1-x-y}N$, $0 \leq x$, $0 \leq y$, $x+y \leq 1$) capable of emitting light in an ultraviolet to visible range. Further, when the light emitting device 11 is employed as the electronic component 11a, the light emitting device 11 may include one semiconductor light emitting element 14, or two or more semiconductor light emitting elements 14. In the case where the light emitting device 11 includes two semiconductor light emitting elements 14, for example, a blue light emitting element and a green light emitting element may be used in combination. Further, in the case where the light emitting device 11 includes three semiconductor light emitting elements 14, for example, a blue light emitting element, a green light emitting element, and a red light emitting element may be used in combination. In the case where two or more semiconductor light emitting elements 14 are provided, the semiconductor light emitting elements are electrically connected to each other in series, in parallel, or in a combination of series and parallel. Further, in the case where the light emitting device 11 is employed as the electronic component 11a, the semiconductor light emitting element 14 may be mounted on the package 13 with its electrode-formed surface facing up (i.e., face-up mounted), or on the package 13 with its electrode-formed surface facing down (i.e., flip-chip mounted). In the case where the semiconductor light emitting element 14 is employed as the electronic component 11a, the first electrode 15 and the second electrode 16 of the semiconductor light emitting element 14 are formed on an identical surface, and the semiconductor light emitting element 14 is mounted on the substrate 12 with its electrode-formed surface facing down (i.e., flip-chip mounted).

In the case where the light emitting device 11 is employed as the electronic component 11a, examples of the material constituting the base member 131 of the package 13 is: ceramic such as aluminum oxide, aluminum nitride or the like; resin such as silicone resin, silicone-modified resin, epoxy resin, epoxy-modified resin, unsaturated polyester resin, phenolic resin, polycarbonate resin, acrylic resin, polymethylpentene resin, polynorbornene resin or hybrid resin containing at least one of the foregoing resins; pulp; glass; or a composite of the foregoing materials. Further, the base member 131 of the package 13 may have a single-layer structure, or a multilayer structure including a plurality of layers.

The base material of the first electrode 15 and the second electrode 16 may be, for example, metal such as copper, aluminum, gold, silver, tungsten, iron, nickel or the like, or alloy such as iron-nickel alloy, phosphor bronze or the like. Further, the first electrode 15 and the second electrode 16 may include a metal layer on the surface of the base material. The metal layer may be, for example, a single layer of or multilayers of silver, aluminum, nickel, palladium, rhodium, gold, copper, or alloy thereof. The first electrode 15 and the second electrode 16 may have a region where the metal layer is absent. Further, in the first electrode 15 and the second electrode 16, the metal layer formed on the upper surface and the metal layer formed on the lower surface may differ from each other. For example, the metal layer formed on the upper surface may be a metal layer configured with multilayers including a nickel layer, and the metal layer formed on the lower surface may be a metal layer not including a nickel layer. Further, the metal layer formed on the upper surface is preferably greater in thickness than the metal layer formed on the lower surface. By virtue of the metal layer on the upper surface side having a greater thickness, light from the semiconductor light emitting element 14 is efficiently reflected upward. The lower surface of the metal layer does not directly reflect light from the semiconductor light emitting element 14. Thus the lower surface of the metal layer can have a smaller thickness to reduce costs of the light emitting device 11. In the case where the thicknesses of the metal layers of the upper surface and the metal layers of the lower surface are different from each other, the thicknesses thereof may be different as a whole by using the same number of the metal layers of the upper or lower surface while setting part or all of their respective layers to be different in thickness from each other. Alternatively, the difference in thickness as a whole may be attained by providing different number of metal layers between the upper surface and on the lower surface.

Further, in the case where a metal layer made of silver or silver alloy is formed on the outermost surface of the first electrode 15 and the second electrode 16, preferably a protective layer made of silicon oxide or such other material is provided on the surface of the metal layer of silver or silver alloy. Thus, the metal layer of silver or silver alloy becomes less likely to discolor due to a sulfur component in the atmosphere. The protective layer can be formed by vacuum processes such as, for example, sputtering, atomic layer deposition, or other known method.

Substrate 12

Figure 3A:
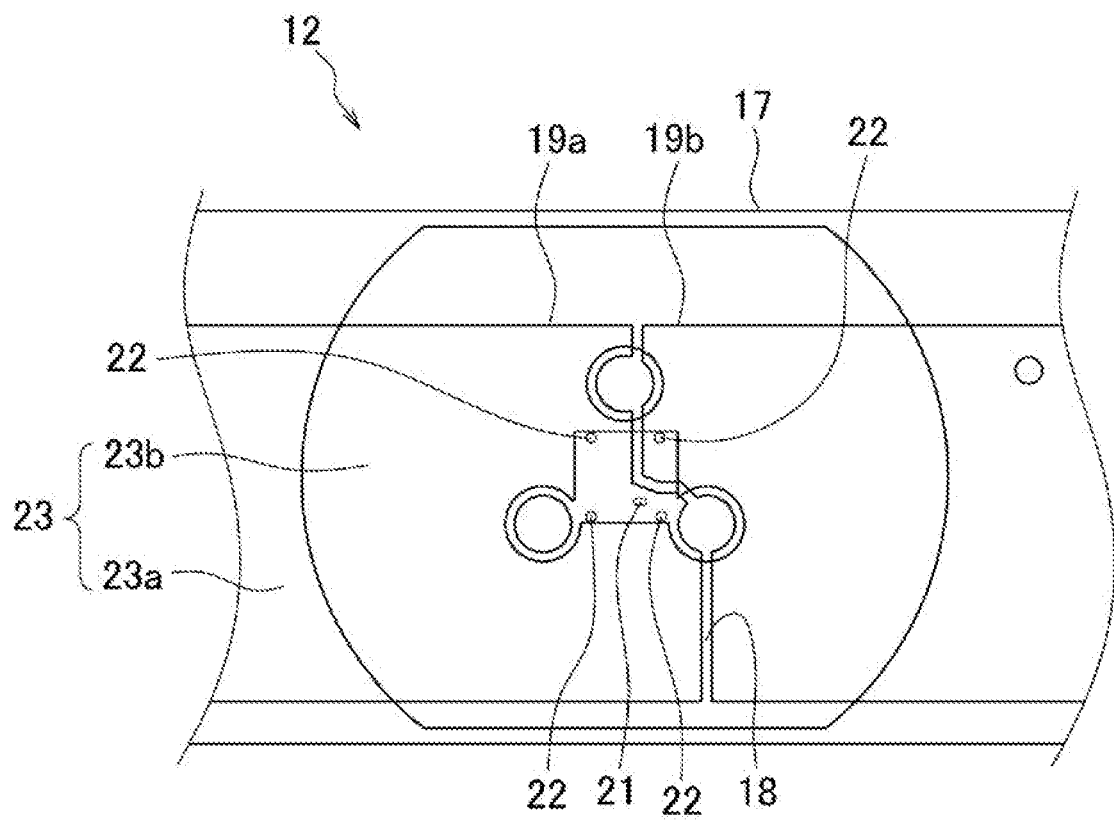
FIG. 3A is a schematic partial top view showing one embodiment of a substrate constituting a part of the light source device shown in FIG. 1.
Figure 3B:
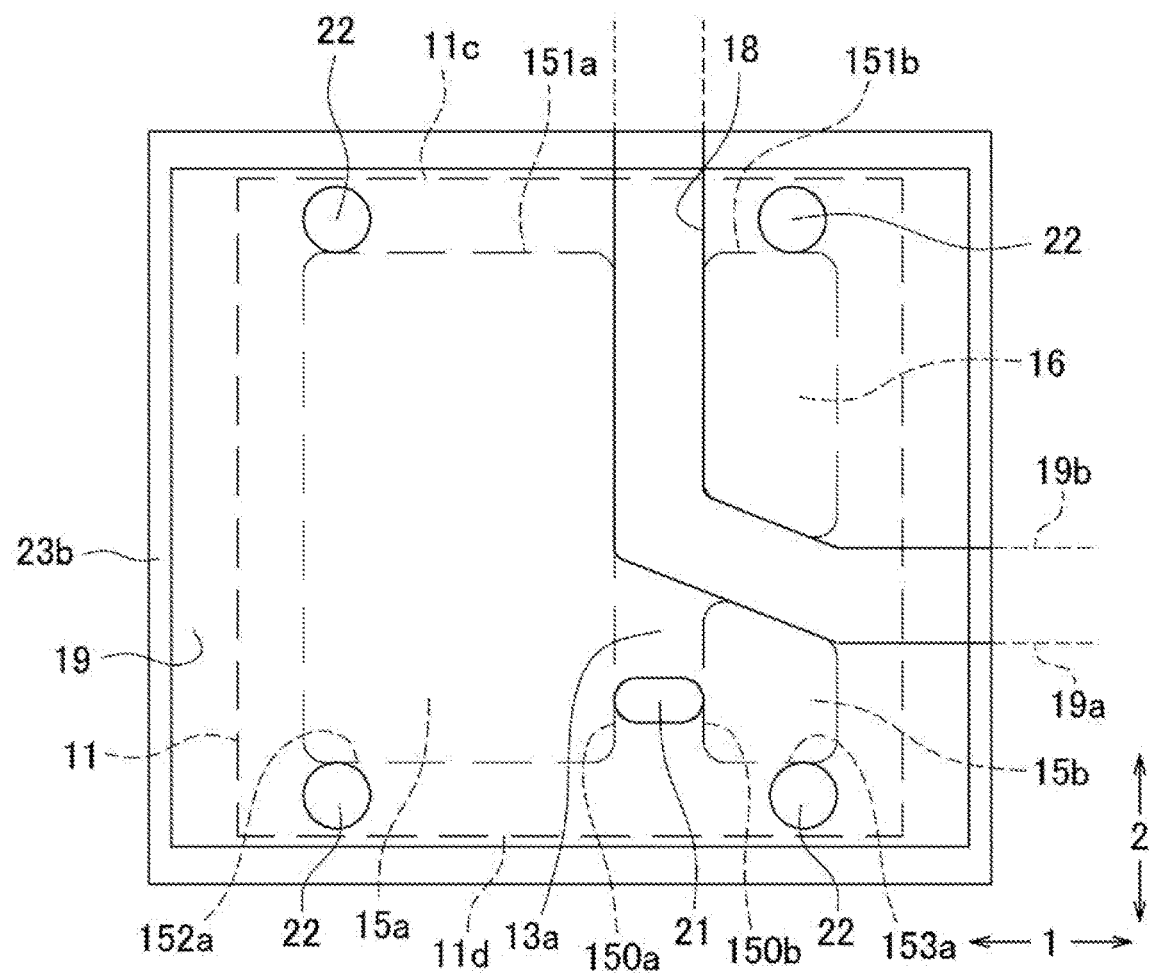
FIG. 3B is a schematic transparent view for illustrating the positional relationship between the substrate and the light emitting device.

FIG. 3A is a schematic partial top view of the substrate 12 before the electronic component 11a is mounted thereon. FIG. 3B is a schematic transparent view for illustrating the positional relationship between the substrate 12 and the electronic component 11a after the electronic component 11a is mounted. As shown in FIG. 3A, the substrate 12 includes a basal member 17 and wiring layers 19 (i.e., a first wiring layer 19a and a second wiring layer 19b). The substrate 12 is a member for mounting the electronic component 11a thereon, and a member constituting a part of the light source device 10. As shown in FIG. 3B, part of the wiring layers 19 is positioned immediately below the electronic component 11a. Specifically, part of the first wiring layer 19a is positioned immediately below the first electrode 15 of the electronic component 11a. Part of the second wiring layer 19b is positioned immediately below the second electrode 16 of the electronic component 11a. Solder electrically connects between the first electrode 15 and the first wiring layer 19a, and between the second electrode 16 and the second wiring layer 19b.

The substrate 12 includes the first region 21 at the position overlapping with the electronic component 11a mounted on the substrate 12 as seen in the top view, where the first region 21 faces the separation region 13a of the lower surface 11b of the electronic component 11a. The first region 21 has poorer (lower) solder wettability than a region on a surface of the wiring layers 19 excluding the first region 21. In FIG. 3B, in the first region 21, a through hole is provided in the first wiring layer 19a. Part of the basal member 17 is exposed at the through hole. The part of the basal member 17 exposed at the through hole has poorer solder wettability than the wiring layers 19. The electronic component 11a is mounted with solder on the substrate 12 so that the separation region 13a of the electronic component 11a and the first region 21 (i.e., the through hole) of the substrate 12 overlaps as seen in the top view. By the electronic component 11a being mounted on the substrate 12 in such disposition, the first region 21 of the substrate 12 is positioned between the first part 15a and the second part 15b of the electronic component 11a, as seen in the top view. Accordingly, part of solder spreading on the first part 15a and part of solder spreading on the second part 15b are separated from each other by the first region 21 with poor wettability. Thus, the pulling force of solder on the first part 15a becomes less likely to influence the second part 15b side, and the pulling force of solder on the second part 15b becomes less likely to influence the first part 15a side. As a result, the self-alignment of the electronic component 11a improves.

The first region 21 having poorer solder wettability than the region on the surface of the wiring layers 19 excluding the first region 21 means that the affinity (ease in attaching) of solder to the first region 21 is lower than the affinity of solder to the region on the surface of the wiring layers 19 excluding the first region 21. The solder wettability can be represented by the contact angle of solder on the surface of the first region 21 or the wiring layers 19. In the region with poor solder wettability, the contact angle of solder becomes great. Accordingly, the contact angle of solder at the first region 21 becomes greater than the contact angle of solder on the surface of the wiring layers 19. The contact angle of solder can be measured by any known method such as the sessile drop method, the pendant drop method, the plate method, or the Washburn method.

After the electronic component 11a is mounted on the substrate 12, the first region 21 positioned in the separation region 13a as seen in the top view is at a position where the first region 21 is substantially in contact with at least one of the inner part 150a of the first part 15a and the inner part 150b of the second part 15b. The position where the first region 21 is substantially in contact with at least one of the inner part 150a and the inner part 150b is, for example, the position spaced apart from one or both of the inner part 150a and the inner part 150b by a distance of about 0 µm to 50 µm. In the case where the first region 21 is at the position where the first region 21 is substantially in contact with the inner part 150a of the first part 15a as seen in the top view, the electronic component 11a is less likely to misaligned from the first part 15a toward the second part 15b. On the other hand, in the case where the first region 21 is at the position where the first region 21 is substantially in contact with the inner part 150b of the second part 15b as seen in the top view, the electronic component 11a is less likely to misaligned from the second part 15b toward the first part 15a. In FIG. 3B, the first region 21 is provided at the position where the first region 21 is in contact with both the inner part 150a of the first part 15a and the inner part 150b of the second part 15b. Thus, misalignment in both the + direction and the − direction of the first direction becomes less prone to occur.

The first region 21 may have any of various shapes. The planar shape of the first region 21 may be a circle, an oval, a polygon, or an irregular shape formed by a combination of the foregoing shapes. The planar shape of the first region 21 is preferably a shape formed to ease such as a circle or an oval. While the first region 21 shown in FIG. 3B is track-like shape elongated in the first direction as seen in the top view, the planar shape of the first region 21 may be, for example, an elongated shape in the second direction, or a substantially angular shape including a straight line parallel to the inner part 150a of the first part 15a or the inner part 150b of the second part 15b.

The width of the first region 21 preferably is the width corresponding to the separation region 13a, that is, the shortest distance between the first part 15a and the second part 15b. The first region 21 may be provided over the entire region overlapping the separation region 13a in the top view. Alternatively, as shown in FIG. 3B, the first region 21 may be part of the region facing the separation region 13a. While providing the single first region 21 for one electronic component 11a will suffice, two or more first regions 21 may be provided in the area corresponding to the separation region 13a.

Further, the substrate 12 may include second regions 22 in addition to the first region 21. The first region 21 and the second regions 22 have poorer solder wettability than the region on the surface of the wiring layer 19 other than the first region 21 and the second regions 22. As described above, the first region 21 is provided on the surface of the substrate 12 at the position facing the separation region 13a on the lower surface 11b of the electronic component 11a. On the other hand, the second regions 22 are provided, at the positions in the surface of the substrate 12 and excluding the position facing the separation region 13a of the lower surface 11b of the electronic component 11a, facing vicinity regions at the outer periphery of the first electrode 15 and the second electrode 16. In FIG. 3B, the second regions 22 are provided on the surface of the substrate 12 at the positions facing the vicinity regions at the four corners of the first electrode 15 and the second electrode 16.

Specifically, the lower surface 11b of the electronic component 11a has a first side 11c and a second side 11d spaced apart from each other in the second direction. The second regions 22 provided on the substrate 12 are at the positions facing the opposite ends of a region defined between the first side 11c and the lateral parts 151a of the first electrode 15, as well as between the first side 11c and the lateral parts 151b of the second electrode 16. Similarly, the second regions 22 provided on the substrate 12 at the positions facing the opposite ends of a region defined between the second side 11d and the lateral parts 152a, 153a of the first electrode 15. The second regions 22 do not include the first wiring layer 19a and the second wiring layer 19b are not provided, and the basal member 17 is exposed. The second regions 22 are at positions where the second regions 22 are substantially in contact with the lateral parts 151a, 152a, 153a, 151b when the electronic component 11a is mounted. "The positions where the second regions 22 are substantially in contact with the lateral parts 151a, 152a, 153a, 151b" are, for example, the positions where the second regions 22 are spaced apart from the lateral parts 151a, 152a, 153a, 151b by a distance of about 0 µm to 50 µm. In this manner, the second regions 22 are provided at the regions on the first side 11c side and the second side 11d side opposing to each other in the second direction in the upper surface of the substrate 12, and the second regions 22 are at positions where the second regions 22 are substantially in contact with the lateral parts of the first electrode 15 and the second electrode 16. Therefore, the electronic component 11a is less likely to misaligned in the second direction when the electronic component 11a is mounted via solder. This improves the self-alignment of the electronic component 11a, and improves mounting accuracy of the electronic component 11a. Further, by providing the second regions 22 at positions facing the vicinity regions of four corners of the first electrode 15 and the second electrode 16, the electronic component 11a is less likely to rotate, and mounting accuracy of the electronic component 11a further improves. The substrate 12 including the first region 21 mitigates misalignment of the electronic component 11a in the first direction.

While a plurality of second regions 22 are provided in the substrate 12 shown in FIG. 3B, single second region 22 may be provided. Further, while the first region 21 and the second regions 22 are preferably equivalent to each other in solder wettability, they may be different from each other.

The first region 21 is not specified to the structure having the through hole is provided on the wiring layers 19. For example, the substrate 12 may have a conductive member or an insulating member on the upper surface of the wiring layers 19 positioned at the first region 21. The conductive member or the insulating member is made of a material with poorer solder wettability than the region on the surface of the wiring layers 19 other than the first region 21. Further the substrate 12 may have the solder wettability partially different by changing the material of part of the wiring layers 19 positioned in the first region 21, or by changing the state (e.g., surface roughness, surface treatment state) of part of the wiring layers 19. The same holds true for the second regions 22.

The insulating member constituting the first region 21 may be silicone resin, silicone-modified resin, epoxy resin, phenolic resin, polycarbonate resin, acrylic resin, polymethylpentene resin, polynorbornene resin, or hybrid resin containing at least one of the foregoing resins. Alternatively, the insulating member may be oxide such as aluminum oxide, or nitride such as aluminum nitride.

The conductive member constituting the first region 21 may be any of the above-mentioned materials as the material of the wiring layers 19, the first electrode 15, and the second electrode 16.

In the case where the basal member 17 exposed at a through hole formed on the wiring layers 19 serves as the first region 21 or the second regions 22, the through hole can be formed simultaneously in the patterning the wiring layers 19. Simultaneously forming the through hole in patterning the wiring layers 19 can realize forming the first region 21 or the second regions 22 at low cost. Alternatively, the through hole may be formed by pressing using a mold assembly, a roll press machine or the like, or perforation by punching or the like.

In the case where a conductive member or an insulating member is employed as the first region 21 or the second regions 22, the conductive member or the insulating member can be disposed at particular positions using photolithography and sputtering, printing or the like. In this case, the thickness of the conductive member or the insulating member is preferably the same or smaller than the thickness of solder used in mounting the electronic component 11a on the substrate 12. This structure does not reduce the volume of the wiring layers 19. Therefore, as compared to the structure in which the through hole is employed, the heat dissipation property of the substrate 12 improves.

In the case where providing the first region 21 and the second regions 22 having the wiring layer whose surface roughness is different to each other, the first region 21 or the second regions 22 can be formed by polishing or laser scribing. In this structure, after the wiring layers 19 is formed, the first region 21 or the second regions 22 can be formed with high freedom in design as necessary.

In addition to the basal member 17 and the wiring layers 19, the substrate 12 preferably includes a covering member 23 covering the upper surface of the wiring layers 19. By virtue of the covering member 23 covering the upper surface of the wiring layers 19, the wiring layers 19 can be protected, and insulation of the substrate 12 is ensured. Further, the covering member 23 is preferably a highly light-reflecting member, and preferably has a layered structure made up of a multilayer. As a preferable structure of the covering member 23, the covering member 23 includes a first covering member 23a and a second covering member 23b. The first covering member 23a covers substantially the entire region of the upper surface of the basal member 17 excluding the region where the electronic component 11a is mounted. The second covering member 23b is a member having light reflectivity higher than the first covering member 23a. The second covering member 23b locally covers the upper surface of the first covering member 23a, for example, only the vicinity of the electronic component 11a. By virtue of the covering member 23 including the first covering member 23a and the second covering member 23b which are positioned as described above, the first covering member 23a can protect the wiring layers 19, and the second covering member 23b can efficiently reflect light emitted from the electronic component 11a (i.e., the light emitting device 11) toward the upper surface. The first covering member 23a and the second covering member 23b may each be a member formed with a resin material containing a light-reflecting substance.

Basal Member 17

At the surface of the basal member 17, the wiring layers 19 is positioned. Examples of the material of the basal member 17 include metal such as aluminum or copper, ceramic such as aluminum oxide or aluminum nitride, resin, pulp, glass, or a composite material of the foregoing materials. Examples of the composite material include glass epoxy, glass silicone, and glass-modified silicone. The basal member 17 may have a single-layer structure or a multilayer structure including a plurality of layers.

Wiring Layers 19

The wiring layers 19 electrically connect to the electronic component 11a to supply electric power to the electronic component 11a. The wiring layers 19 is disposed on the upper surface of the basal member 17. The wiring layers 19 includes the first wiring layer 19a and the second wiring layer 19b. The first wiring layer 19a and the second wiring layer 19b are spaced apart from each other having a groove 18 interposed between them.

The wiring layers 19 may be formed by, for example, metal such as copper, aluminum, gold, silver, tungsten, iron, or nickel, or alloy such as iron-nickel alloy, or phosphor bronze. The surface of the wiring layers 19 may be covered with a metal layer or the like.

The substrate 12 may include other wiring layer in addition to the wiring layers 19 depending on the number of the electronic component 11a mounted on the basal member 17, the connection manner of the electronic component 11a, or the number of external electrodes (or terminals) per electronic component and the like. Other wiring layer may be, for example, intended to heat dissipation but not contribute to electrical connection. The first wiring layer 19a and the second wiring layer 19b may have a size and shape different from each other as seen in the top view.

The groove 18 positioned between the first wiring layer 19a and the second wiring layer 19b face the region between the first electrode 15 and the second electrode 16 of the electronic component 11a.

The planar shape of the groove 18 has preferably a bent portion immediately below one electronic component. While the bending direction of the groove 18 is not particularly specified, for example, the groove 18 may extend in the second direction, and be bent toward the first direction. The bent portion from the second direction to the first direction may be one or more. Further, the bent portion from the first direction to the second direction may exist one or more.

As seen in the top view, the shape or size of the groove 18 facing the region between the first electrode 15 and the second electrode 16 preferably substantially coincides with the shape or size of the region between the first electrode 15 and the second electrode 16.

The wiring layers 19 can be formed on the basal member 17 in any shape by methods known in the art. For example, a material of the wiring layers may be formed as a film by sputtering or the like via a mask, and the film may be patterned by the lift-off process. Alternatively, a material of the wiring layers may be formed as a film on the entire surface of the basal member 17 by vapor deposition or the like, and the film may be patterned using a mask by photolithography or the like. Further, the wiring layers 19 may be formed by bonding previously patterned wirings onto the basal member 17.

The electronic component 11a is mounted on the upper surface of the wiring layers 19 of the substrate 12 via solder. The material of the solder may be, for example, an alloy whose main component is Ag, Cu, and Sn, an alloy whose main component is Cu and Sn, and an alloy whose main component is Bi and Sn.

In general, such a mounting manner via solder may cause solder spreading on an upper surface of wiring layers, whereby misalignment of the electronic component may occur. In contrast, the light source device 10 of the present disclosure can effectively facilitate the self-alignment of the electronic component 11a after being mounted by virtue of the substrate 12 including the above-described first region 21 and second regions 22. As a result, mount precision of the electronic component 11a improves.

Other Members

In the case where the light emitting device 11 is employed as the electronic component 11a, the light emitting device 11 may further include an optical member such as a sealing member, and a protective element such as a Zener diode 25. Such components may be disposed, for example on/above the upper surface serving as the light extraction surface.

First Embodiment

As shown in FIG. 1, the light source device 10 according to the first embodiment includes the light emitting device 11 corresponding to the electronic component 11a, and the substrate 12.

As shown in FIGS. 2A to 2C, the light emitting device 11 includes two semiconductor light emitting elements 14, and the package 13 in which the semiconductor light emitting elements 14 are mounted.

The package 13 includes the base member 131 containing epoxy resin containing titanium oxide by 15 wt % to 25 wt %, and the first electrode 15 and the second electrode 16. The package 13 has a substantially square planar shape (for example, 3 mm×3 mm). The first electrode 15 and the second electrode 16 include copper layer and a metal layer formed on the copper layer. The first electrode 15 and the second electrode 16 are formed to have a maximum thickness of 200 μm. The first electrode 15 and the second electrode 16 are respectively electrically connected to a pair of electrodes of each of the semiconductor light emitting elements 14 via wires.

The first electrode 15 includes the first part 15a and the second part 15b on the lower surface 11b of the light emitting device 11. The first part 15a and the second part 15b are separated from each other by the separation region 13a on the lower surface 11b.

Figure 2D:
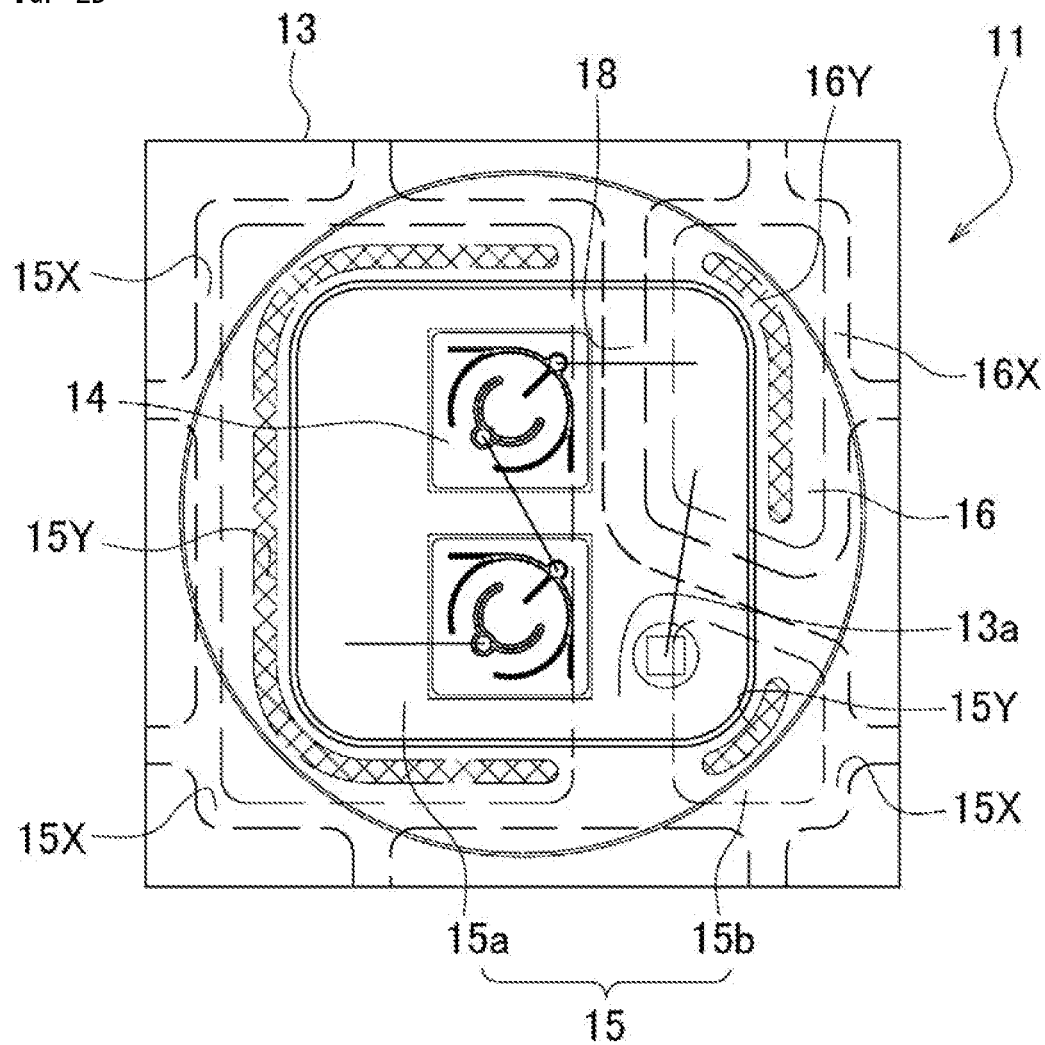
FIG. 2D is a schematic transparent view of the light emitting device shown in FIG. 2A as seen in a top view.

FIG. 2D is a transparent top view of the light emitting device 11 according to the first embodiment. As shown in FIG. 2D, the first electrode 15 and the second electrode 16 include recessed parts recessed in a direction from the lower surface to the upper surface at outer periphery portions 15X, 16X, and at the separation region 13a between the first part 15a and the second part 15b. At the upper surface of the first electrode 15 and the second electrode 16, depressions 15Y, 16Y are provided for improving adhesion between the base member 131 containing a resin material and the first electrode 15 and the second electrode 16. The depression 15Y formed on the upper surface of the first part 15a and the depression 15Y formed on the upper surface of the second part 15b are separated from each other at a region overlapping with the separation region 13a as seen in the top view. This structure discourages or prevents the recessed part formed on the lower surface of the first electrode 15 and the depression 15Y formed on the upper surface from overlapping with each other as seen in the top view, whereby strength of the first electrode 15 is ensured.

The first part 15a has an area greater than an area of the second part 15b on the lower surface 11b of the light emitting device 11, in plan view.

As shown in FIGS. 3A and 3B, the substrate 12 includes the basal member 17 and wiring layers 19. The basal member 17 according to the first embodiment is formed with glass epoxy having a single-layer structure, and the wiring layers 19 is formed with copper.

The substrate 12 includes the first region 21 at the position facing the separation region 13a on the lower surface 11b of the light emitting device 11, at the position where the light emitting device 11 is mounted. The first region 21 has poorer solder wettability than the region on the surface of the wiring layers 19 excluding the first region 21 and the second regions 22. Specifically, a through hole is formed on the wiring layers 19 positioned at the first region 21. Part of the basal member 17 is exposed at the through hole. In other words, in the wiring layers 19 containing copper, a through hole is provided in the wiring layers 19 positioned at the first region 21, and the basal member 17 containing glass epoxy is exposed at the through hole. That is, the first region 21 according to the first embodiment is part of the basal member 17. The surface of the basal member 17 containing glass epoxy has poorer solder wettability than the surface of the wiring layers 19 containing copper.

The substrate 12 further includes four second regions 22 in addition to the first region 21. The first region 21 and the second regions 22 have poorer solder wettability than the region on the surface of the wiring layers 19 excluding the first region 21 and the second regions 22. Similarly to the first region 21, through holes are provided at the second regions 22, and part of the basal member 17 is exposed at the through holes. That is, the second regions 22 according to the first embodiment are part of the basal member 17.

The wiring layers 19 are disposed on/above the upper surface of the basal member 17 having the groove 18 interposed between them. The groove 18 is positioned on the upper surface of the substrate 12 to face the region between the first electrode 15 and the second electrode 16 of the light emitting device 11. The width of the groove is, for example, 400 μm.

The groove 18 is bent immediately below one semiconductor light emitting element 14, conforming to the shape of the region spaced apart between the first electrode 15 and the second electrode 16.

The surface of the wiring layers 19 is partially covered with the covering member 23. The covering member 23 covers the surface of the basal member 17 and the wiring layer except for part that is necessary for establishing electrical connection with the light emitting device 11. That is, the covering member 23 has an opening to expose the region where the light emitting device 11 is to be mounted.

The covering member 23 includes the first covering member 23a that covers substantially the entire surface of the wiring layers 19, and the second covering member 23b disposed only around the light emitting device 11.

The light emitting device 11 is mounted on the wiring layer 19 of the substrate 12 via solder. The material of the solder is, for example, alloy whose main component is Ag, Cu, and Sn. When the light emitting device 11 is mounted via solder, normally, the solder spreads on the upper surface of the wiring layer, which may cause misalignment of the light emitting device 11 or rotation of the light emitting device. However, the light source device 10 of the present disclosure effectively attenuates misalignment of the light emitting device 11 by disposing the first region 21 and the second regions 22 at specific positions in the substrate 12. In the case where the light source device 10 is used as a light source for a direct backlight, a lens member may be provided on the upper surface of each light emitting device 11. In such cases also, by virtue of misalignment of the light emitting device 11 being effectively reduced, the light source device 10 of the present disclosure effectively facilitates alignment of the optical axis of each light emitting device 11 and the optical axis of each lens member.

Second Embodiment

Figure 4A:
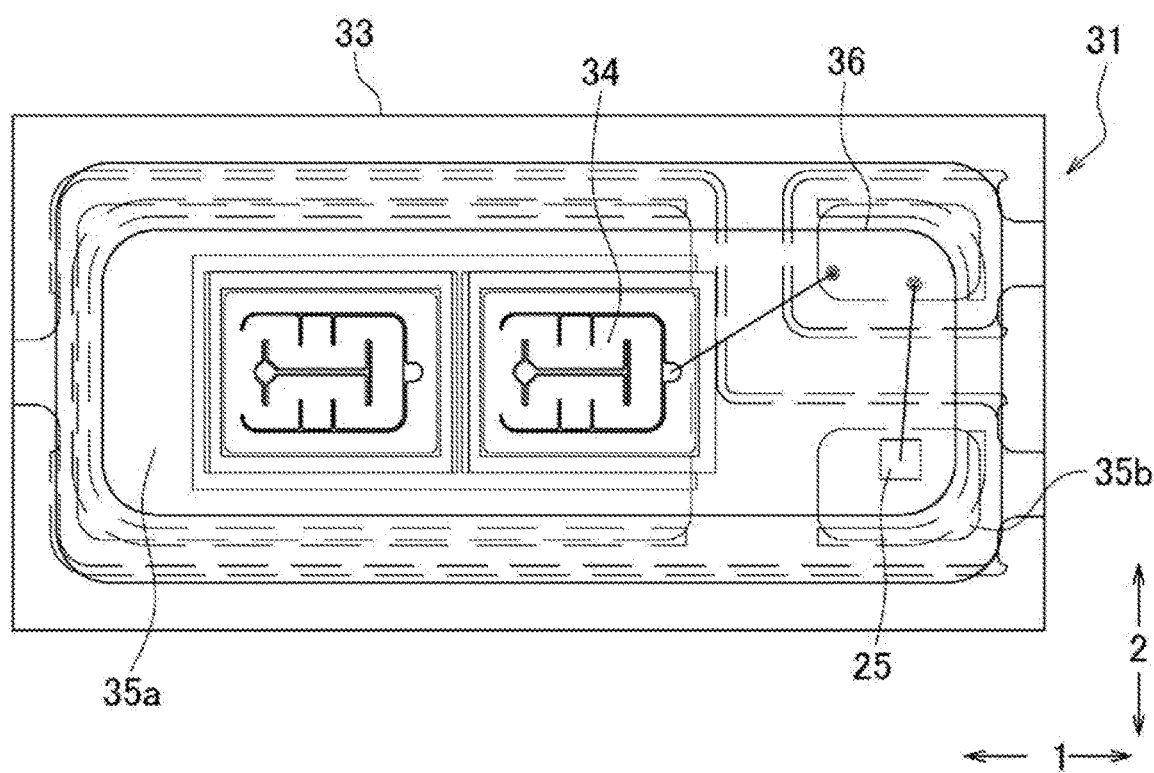
FIG. 4A is a schematic transparent view showing other embodiment of the light emitting device of the light source device of the present disclosure.
Figure 4B:
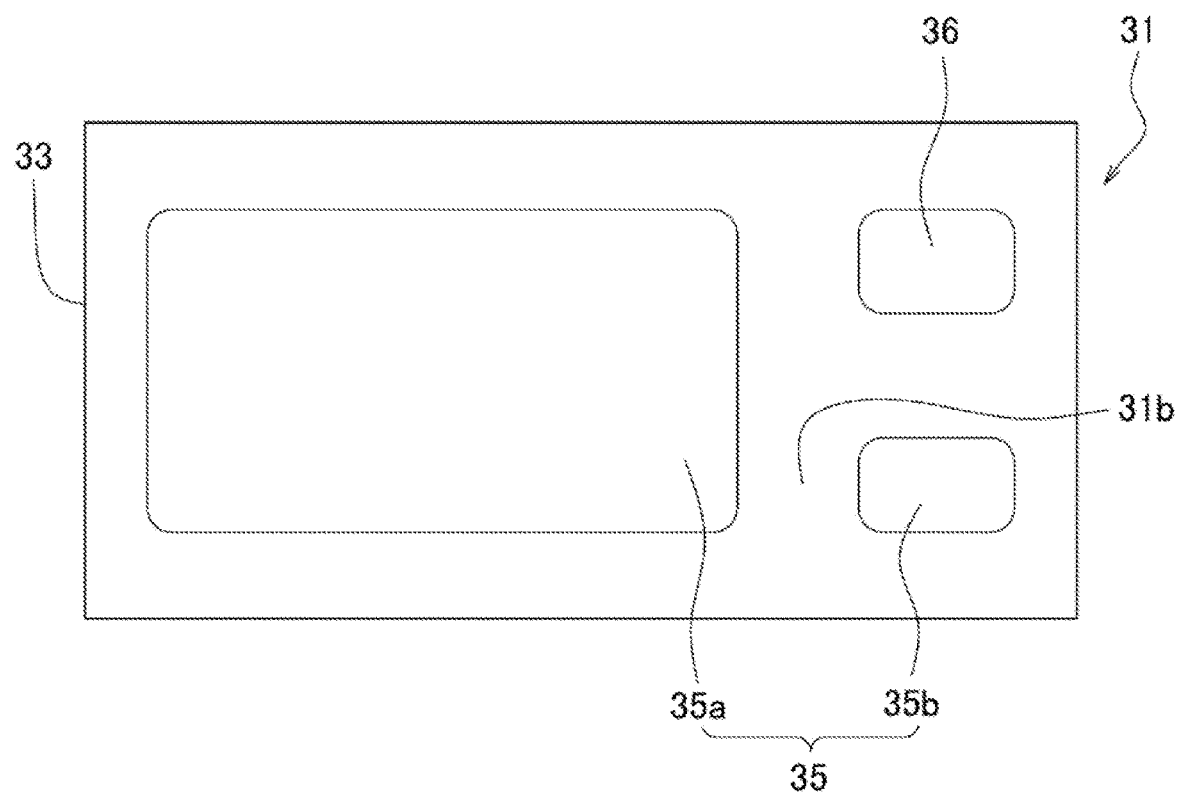
FIG. 4B is a schematic bottom view showing the light emitting device shown in FIG. 4A.
Figure 4C:
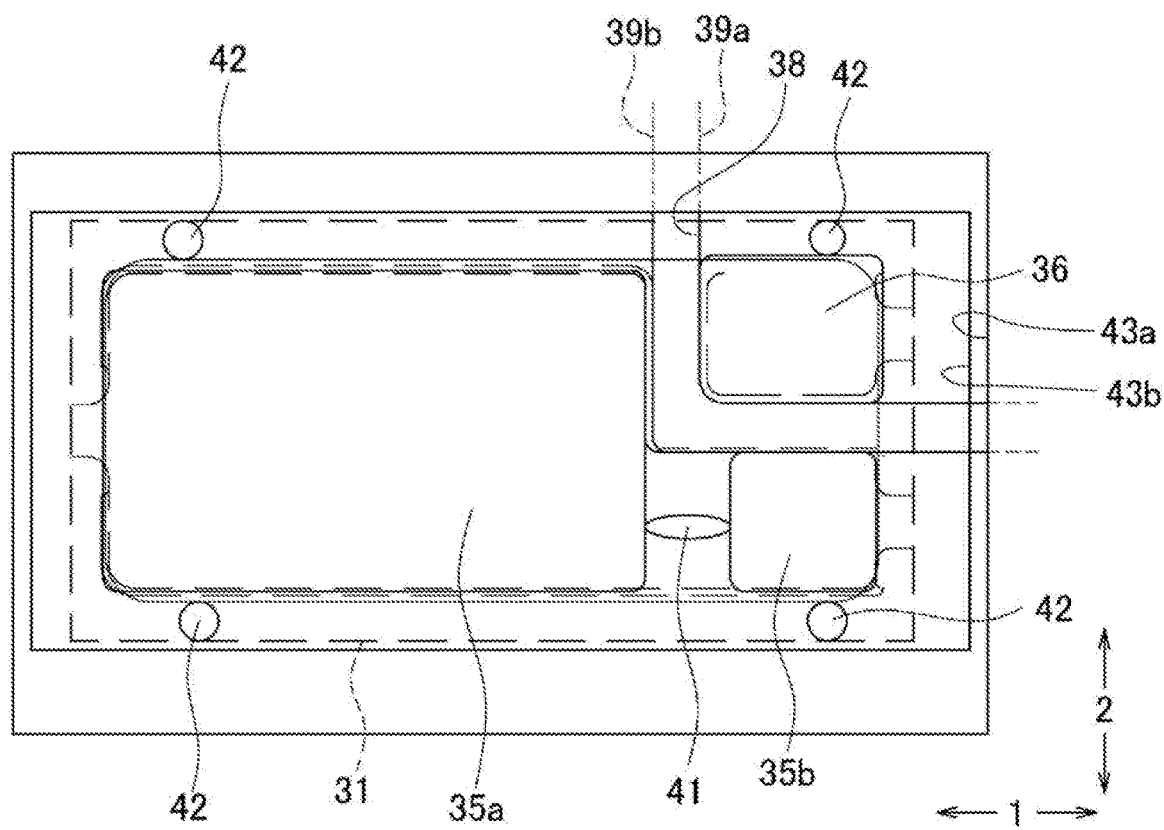
FIG. 4C is a schematic transparent view for illustrating the positional relationship between the substrate and the light emitting device.

As shown in FIGS. 4A to 4C, a light source device 10 according to the second embodiment includes a light emitting device 31 corresponding to the electronic component 11a and a substrate. FIG. 4A is a schematic transparent view of the light emitting device 31 as seen in a top view. FIG. 4B is a schematic bottom view showing the light emitting device 31 shown in FIG. 4A. FIG. 4C is a schematic transparent view describing the positional relationship between the substrate 12 and the light emitting device 31.

As shown in FIG. 4A, the light emitting device 31 has an rectangular shape elongated in the first direction, and includes a package 33, and two semiconductor light emitting elements 34 mounted on the package 33. The light emitting device 31 includes a first electrode 35 and a second electrode 36. At least part of the first electrode 35 and the second electrode 36 are exposed at the lower surface of the light emitting device 31. The first electrode 35 includes a first part 35a and a second part 35b on the lower surface of the light emitting device 31. The first part 35a and the second part 35b are separated from each other via a separation region 31b.

The first part 35a and the second part 35b of the first electrode 35 are adjacent to each other in the first direction.

As shown in FIG. 4C, the substrate includes wiring layers 39a, 39b disposed on its upper surface. A groove 38 is formed between the wiring layers 39a, 39b.

The groove 18 extends in the second direction and is bent in the first direction immediately below one light emitting device 31, conforming to the shape of the first electrode 35 and the second electrode 36.

The substrate includes a first region 41 at the position where the light emitting device 31 is mounted and face the separation region 31b on the lower surface of the light emitting device 31. The substrate further includes four second regions 42 in addition to the first region 41. A through hole is formed at a position in the wiring layers 39a, 39b corresponding to the first region 41. Part of the basal member is exposed at the bottom of the through hole. Similarly, through holes are formed in the wiring layers 39a, 39b positioned at the second region 42. Part of the basal member is exposed at the bottom of the through holes.

The light source device 10 is structured similarly to the first embodiment other than the structures described above.

In this manner, providing the first region 21 and the second regions 22 at specific positions in the substrate 12 effectively attenuates misalignment of the light emitting device 31. As a result, the self-alignment of the light emitting device 31 is effectively ensured, whereby mount accuracy of the light emitting device 31 improves.

OTHER EMBODIMENT

Figure 5:
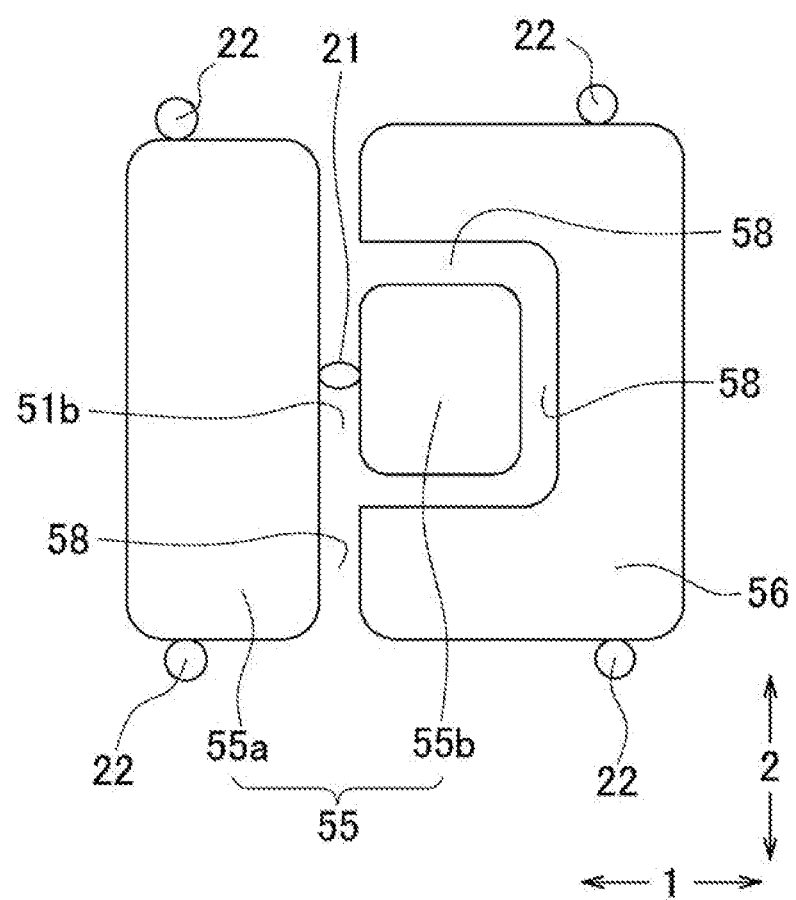
FIG. 5 is a schematic transparent view for illustrating the positional relationship between the substrate and the light emitting device.

The first electrode and the second electrode of the electronic component according to the present disclosure may have any of various shapes. FIG. 5 is a schematic diagram showing a first electrode 55 and a second electrode 56 exposed at the lower surface of the electronic component, and the first region 21 and the second region 22 on the substrate. For the sake of brevity, the outer shape of the electronic component, the substrate and the like are not shown.

As shown in FIG. 5, the first electrode 55 has a protrusion as seen in the top view. The second electrode 56 opposes to the first electrode 55 and has a depression that accommodates the protrusion of the first electrode 55. The first electrode 55 includes a substantially angular first part 55a and a substantially angular second part 55b corresponding to the protrusion, the both pats positioned on the lower surface of the electronic component. The first region 21 is disposed at the position between the first part 55a and the second part 55b facing the separation region 51b. Four second regions 22 are respectively disposed around the corners of the first electrode 55 and the second electrode 56. The substrate includes wiring layers on the upper surface, and the groove 58 is provided between the wiring layers.

The first electrode and the second electrode having such shapes also exhibit the effect similar to that the first embodiment exhibits.

What is claimed is:

1. A light source device comprising:
   a package including a first electrode and a second electrode, the first electrode having a first part and a second part separated from each other by a first separation region on a lower surface side of the first electrode while the first part is continuous with the second part on an upper surface side of the first electrode; and
   a substrate including a pair of wiring members, lower surfaces of the first part and the second part of the first electrode facing and being mounted on an upper surface of one of the wiring members, and a lower surface of the second electrode facing and being mounted on an upper surface of the other of the wiring members, a region of the substrate facing the first separation region having solder wettability lower than solder wettability of the upper surface of the one of the wiring members facing the first part and the second part of the first electrode.

2. The light source device according to claim 1, further comprising
   a semiconductor light emitting element mounted on the package.

3. The light source device according to claim 2, wherein the semiconductor light emitting element is mounted on at least one of an upper surface of the first electrode and an upper surface of the second electrode.

4. The light source device according to claim 3, wherein the semiconductor light emitting element is mounted on and electrically connected to the upper surface of the first electrode, and electrically connected to the second electrode via a wire.

5. The light source device according to claim 3, wherein the semiconductor light emitting element is mounted on the upper surface of the first electrode and the upper surface of the second electrode.

6. The light source device according to claim 1, further comprising
   a plurality of semiconductor light emitting elements mounted on the package, with at least one of the semiconductor light emitting elements being mounted on an upper surface of the first electrode and at least one of the semiconductor light emitting elements being mounted on an upper surface of the second electrode.

7. The light source device according to claim 1, wherein each of the first electrode and the second electrode includes a plurality of metal layers with an outermost layer of the metal layers arranged on an upper surface side of the package being different from an outermost layer of the metal layers arranged on a lower surface side of the package.

8. The light source device according to claim 1, wherein the first electrode and the second electrode are separated from each other by a second separation region on a lower surface of the package, the second separation region being continuous with the first separation region.

9. The light source device according to claim 8, wherein the first electrode and the second electrode are arranged so that a virtual straight line passes through the first separation region and the second separation region.

10. The light source device according to claim 1, wherein the package has a quadrangle shape in a top view having a pair of first sides extending along a first direction and a pair of second sides extending along a second direction intersecting the first direction, the first part and the second part of the first electrode are separated from each other in the first direction on a lower surface of the package, and the first electrode and the second electrode are separated from each other in the first direction on the lower surface of the package.

11. The light source device according to claim 10, wherein on the lower surface of the package, a length in the first direction of the first part of the first electrode is longer than a length in the first direction of the second part of the first electrode.

12. The light source device according to claim 10, wherein on the lower surface of the package, a length in the second direction of the first part of the first electrode is longer than a length in the second direction of the second part of the first electrode.

13. The light source device according to claim 11, wherein on the lower surface of the package, a length in the second direction of the first part of the first electrode is longer than a length in the second direction of the second part of the first electrode.

14. The light source device according to claim 10, wherein on the lower surface of the package, the second part of the first electrode and the second electrode are both arranged between virtual lines extended along the first direction from edges in the second direction of the first part of the first electrode.

* * * * *